United States Patent
Ahn et al.

(10) Patent No.: US 8,402,980 B2
(45) Date of Patent: Mar. 26, 2013

(54) APPARATUS AND METHOD OF GENERATING ULTRASONIC VIBRATION AND APPARATUS AND METHOD OF CLEANING A WAFER USING THE SAME

(75) Inventors: Young-Ki Ahn, Icheon-si (KR); Jae-Jeong Jeong, Cheonan-si (KR); Bo-Ram-Chan Sung, Asan-si (KR)

(73) Assignee: Semes Co., Ltd., Cheonan-si (KR)

( * ) Notice: Subject to any disclaimer, the term of this patent is extended or adjusted under 35 U.S.C. 154(b) by 576 days.

(21) Appl. No.: 12/209,254

(22) Filed: Sep. 12, 2008

(65) Prior Publication Data
US 2009/0071504 A1 Mar. 19, 2009

(30) Foreign Application Priority Data
Sep. 19, 2007 (KR) .................. 10-2007-0095008

(51) Int. Cl.
*B08B 3/00* (2006.01)
*B08B 3/12* (2006.01)
*B08B 6/00* (2006.01)
(52) U.S. Cl. .................. 134/184; 134/902
(58) Field of Classification Search .......... 134/184, 134/902
See application file for complete search history.

(56) References Cited

U.S. PATENT DOCUMENTS

| | | | |
|---|---|---|---|
| 5,003,516 A * | 3/1991 | Sato et al. | 367/150 |
| 5,511,296 A * | 4/1996 | Dias et al. | 29/25.35 |
| 5,894,452 A * | 4/1999 | Ladabaum et al. | 367/163 |
| 2003/0062071 A1* | 4/2003 | Sorbo et al. | 134/184 |
| 2004/0009740 A1* | 1/2004 | Verhaverbeke | 451/42 |
| 2005/0284509 A1* | 12/2005 | Sakurai et al. | 134/184 |

FOREIGN PATENT DOCUMENTS

| | | |
|---|---|---|
| JP | 2000-216126 | 1/1999 |
| KR | 1019990023329 A | 3/1999 |
| KR | 1020040003714 A | 1/2004 |
| KR | 1020050017923 A | 2/2005 |

OTHER PUBLICATIONS

Japanese Office Action dated Aug. 31, 2010 for Japanese Patent Application No. 2008-241476, 6 pages.
Korean Office Action for Korean Patent Application No. 2007-95008 dated Aug. 26, 2008, 5 pages from which present U.S. Application claims priority.

* cited by examiner

*Primary Examiner* — Michael Barr
*Assistant Examiner* — Charles W Kling
(74) *Attorney, Agent, or Firm* — Daly, Crowley, Mofford & Durkee, LLP

(57) ABSTRACT

In an apparatus and method of generating an ultrasonic vibration, an ultrasonic vibration generated in an ultrasonic vibration generator is transmitted through a material layer to control the intensity and the direction of the ultrasonic vibration. In an apparatus and method of cleaning a wafer, a cleaning solution supplier supplies a cleaning solution for cleaning the wafer onto the wafer. An ultrasonic vibration generator generates an ultrasonic vibration. The ultrasonic vibration is transmitted through a material layer of a transmission member to control the intensity and the direction of the ultrasonic vibration. The ultrasonic vibration is applied to the cleaning solution.

20 Claims, 4 Drawing Sheets

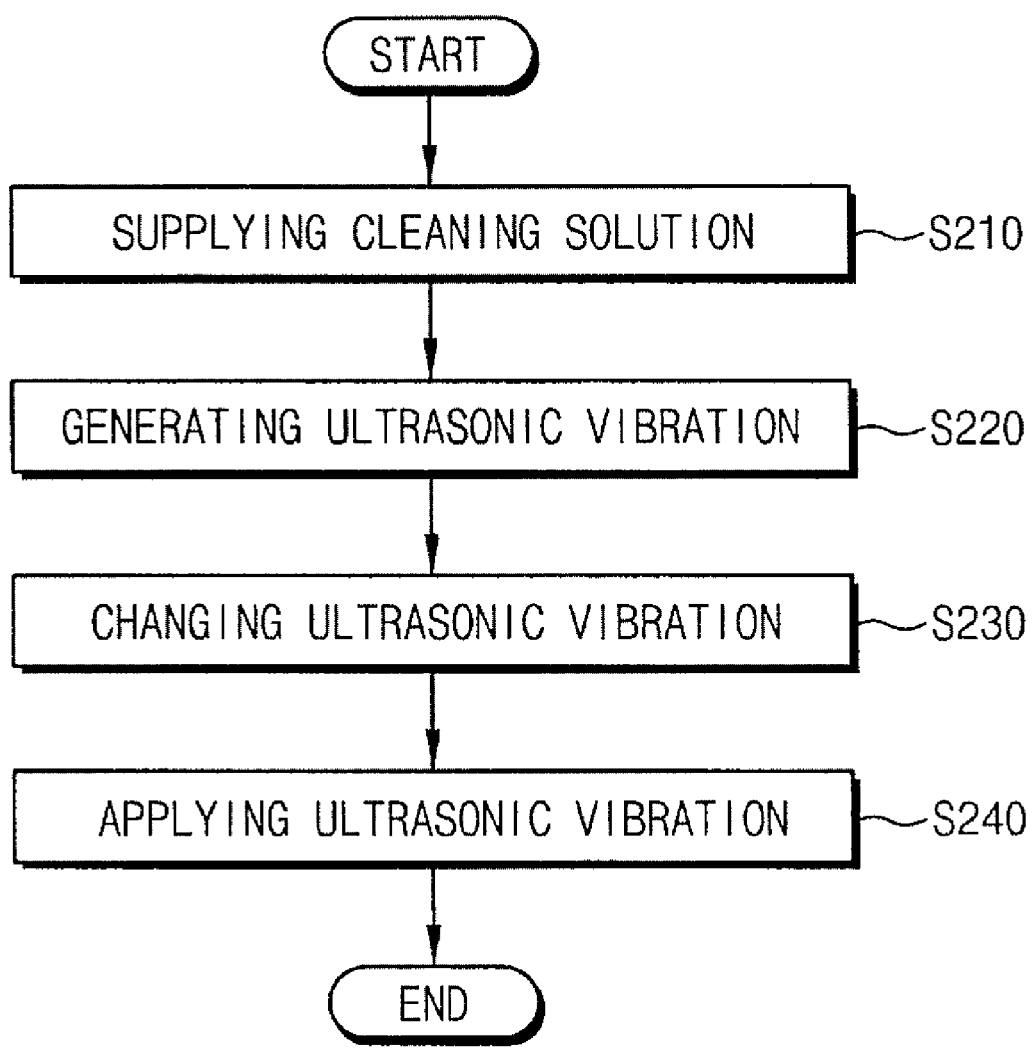

APPARATUS AND METHOD OF GENERATING ULTRASONIC VIBRATION AND APPARATUS AND METHOD OF CLEANING A WAFER USING THE SAME

CROSS-REFERENCE TO RELATED APPLICATIONS

This application claims priority under 35 U.S.C. §119 to Korean Patent Application No. 2007-95008, filed on Sep. 19, 2007 in the Korean Intellectual Property Office (KIPO), the contents of which are herein incorporated by reference in their entirety.

BACKGROUND OF THE INVENTION

1. Field of the Invention

The present invention relates to an apparatus and a method of generating ultrasonic vibration, and an apparatus and a method of cleaning a wafer using the same. More particularly, the present invention relates to an apparatus and a method of applying ultrasonic vibration to a cleaning solution for cleaning a wafer, and an apparatus and a method of cleaning the wafer using the same.

2. Description of the Related Art

Generally, semiconductor devices are manufactured by repeatedly performing unit processes. The unit processes include a deposition process, a photolithography process, an etching process, a chemical and mechanical polishing process, a cleaning process, a drying process, etc. In the cleaning process, particles and unnecessary layers formed on the wafer during the above unit processes are removed from the wafer. Recently, as a pattern formed on the wafer is gradually shrunk and the aspect ratio of the pattern is gradually increased, the cleaning process becomes much more important.

Conventionally, an apparatus for cleaning a wafer includes a cleaning solution provider for providing a cleaning solution onto the wafer and an ultrasonic vibrator for applying an ultrasonic vibration to the clean solution.

The ultrasonic vibrator merely transmits the ultrasonic vibration without any variation in the intensity and direction of the ultrasonic vibration. Therefore, when the intensity of the ultrasonic vibration is non-uniform, the wafer may be non-uniformly cleaned by the ultrasonic vibration.

Further, when the cleaning solution is not distributed on the wafer to a sufficient thickness and the ultrasonic vibration applied to the wafer has an excessively high intensity, there is a problem in that the ultrasonic vibration may cause significant damage to the pattern on the wafer.

SUMMARY OF THE INVENTION

The present invention provides an apparatus for generating an ultrasonic vibration capable of controlling the intensity and the direction of an ultrasonic vibration transmitted to a cleaning solution.

The present invention also provides a method of generating an ultrasonic vibration capable of controlling the intensity and the direction of an ultrasonic vibration transmitted to a cleaning solution.

The present invention provides an apparatus for cleaning a wafer including the apparatus for generating an ultrasonic vibration.

The present invention provides a method of cleaning a wafer including the method of generating an ultrasonic vibration.

In example embodiments of the present invention, the apparatus of generating an ultrasonic vibration may include an ultrasonic vibration generator and a transmission member. The ultrasonic vibration generator generates an ultrasonic vibration. The transmission member is positioned at an end portion of the ultrasonic vibration generator and includes a material for controlling the intensity and the direction of the ultrasonic vibration. The ultrasonic vibration is transmitted to a cleaning solution for cleaning a wafer through the transmission.

According to example embodiments, the material of the transmission member includes one of a solid phase, a liquid phase and a gas phase.

According to example embodiments, the materials are arranged into at least one material layer in the transmission member and the intensity and the direction of the ultrasonic vibration are changed in accordance with at least one of the number of the material layers, the thickness of each material layer and the width of each material layer. In example embodiments of the present invention, the method of generating an ultrasonic vibration is provided. An ultrasonic vibration is generated. The intensity and the direction of the ultrasonic vibration are changed by transmitting the ultrasonic vibration through a material layer. According to example embodiments, the material layer includes a material having one of a solid phase, a liquid phase and a gas phase. According to example embodiments, the intensity and the direction of the ultrasonic vibration are changed in accordance with at least one of the number of component layers, the thickness of each component layer and the width of each component layer in the material layer.

In example embodiments of the present invention, the apparatus of cleaning a wafer may include a cleaning solution supplier, an ultrasonic vibration generator and a transmission member. The cleaning solution supplier is positioned over the wafer and may supply a cleaning solution onto the wafer. The ultrasonic vibration generator is positioned over the wafer and generates an ultrasonic vibration. The transmission member is positioned at an end portion of the ultrasonic vibration generator and including a material for controlling the intensity and the direction of the ultrasonic vibration. The ultrasonic vibration is transmitted to a cleaning solution for cleaning a wafer through the transmission member.

According to example embodiments, the material layer of the transmission member includes one of a solid phase, a liquid phase and a gas phase.

According to example embodiments, the materials are arranged into at least one material layer in the transmission member and the intensity and the direction of the ultrasonic vibration are changed in accordance with at least one of the number of the material layers, the thickness of each material layer and the width of each material layer so that the intensity and the direction of the ultrasonic vibration are corresponding to a shape of a pattern formed on the wafer.

According to example embodiments, the transmission member is integrally formed in one body together with the vibration generator.

In example embodiments of the present invention, the method of cleaning a wafer is provided. A cleaning solution is supplied onto a wafer. An ultrasonic vibration is generated. The intensity and the direction of the ultrasonic vibration are controlled by transmitting the ultrasonic vibration through a material layer. The ultrasonic vibration is applied to the cleaning solution.

According to example embodiments, the material layer includes a material having one of a solid phase, a liquid phase and a gas phase. According to example embodiments, wherein the materials are arranged into at least one material layer in the transmission member and the intensity and the direction of the ultrasonic vibration are changed in accordance with at least one of the number of the material layers, the thickness of each material layer and the width of each material layer so that the intensity and the direction of the ultrasonic vibration are corresponding to a shape of a pattern formed on the wafer.

According to the present invention, the intensity and the direction of the ultrasonic vibration are changed in accordance with at least one of the number of the material layers, the thickness of each material layer and the width of each material layer. After the intensity and the direction of the ultrasonic vibration are controlled, the ultrasonic vibration is applied to the cleaning solution on the wafer. Accordingly, the wafer may be easily cleaned.

BRIEF DESCRIPTION OF THE DRAWINGS

The above and other features and advantages of the present invention will become readily apparent by reference to the following detailed description when considered in conjunction with the accompanying drawings, in which:

FIG. 7 is a flowchart illustrating a method of cleaning a wafer in accordance with an example embodiment of the present invention.

DESCRIPTION OF THE EMBODIMENTS

Figure 1:
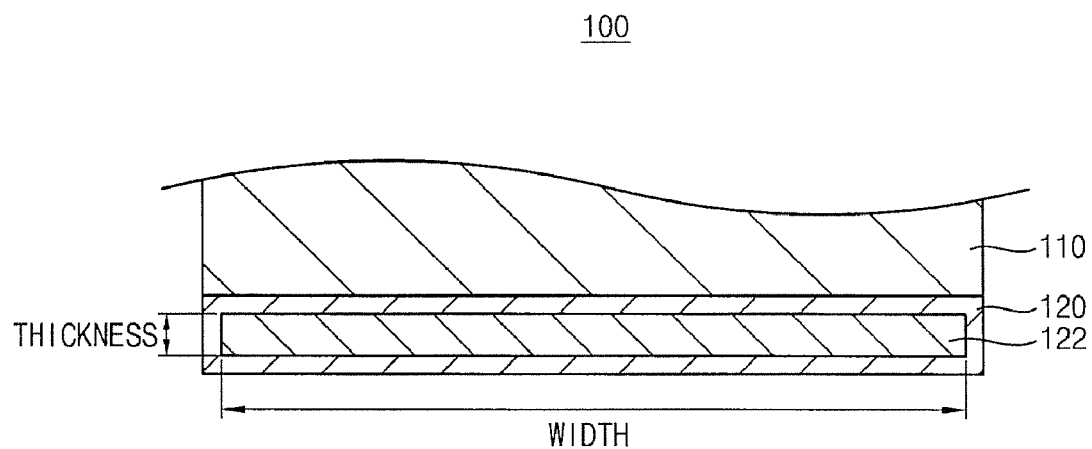
FIG. 1 is a cross-sectional view illustrating an apparatus of generating an ultrasonic vibration in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on" or "connected to" another element or layer, it can be directly on, connected or coupled to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
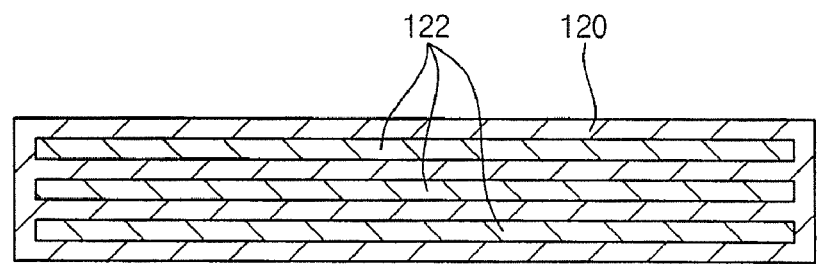
FIGS. 2 to 4 are cross-sectional views illustrating a transmission member in accordance with other example embodiments of the present invention.
Figure 3:
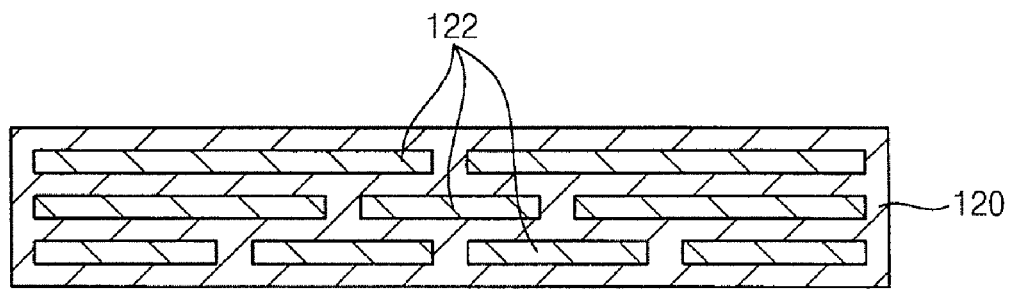
Figure 4:
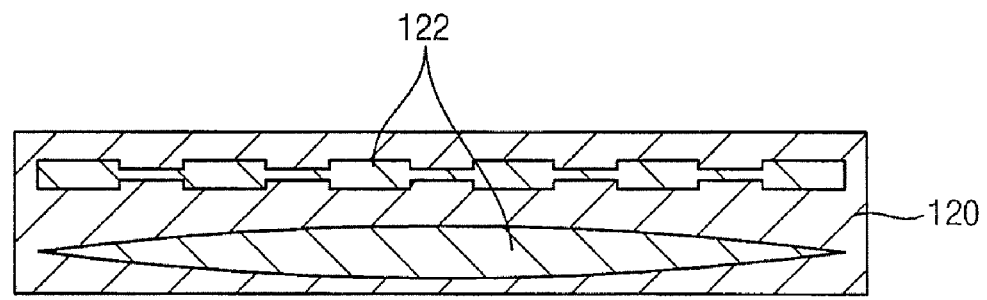

FIG. 1 is a cross-sectional view illustrating an apparatus of generating an ultrasonic vibration 100 in accordance with example embodiments of the present invention and FIGS. 2 to 4 are cross-sectional views illustrating a transmission member 120 of the apparatus shown in FIG. 1 in accordance with other example embodiments of the present invention.

Referring to FIGS. 1 to 4, the apparatus of generating the ultrasonic vibration 100 may include an ultrasonic vibration generator 110 and a transmission member 120.

The ultrasonic vibration generator 110 is positioned over a wafer that is to be cleaned and generates an ultrasonic vibration. For example, the ultrasonic vibration generator 110 may include a piezoelectric transducer for converting electric energy into physical vibration energy.

The transmission member 120 is positioned at an end portion of the ultrasonic vibration generator 110. The transmission member 120 may be shaped into a disc having a size similar to or the same as that of the wafer or may be shaped into a bar having a length similar to or the same as a diameter of the wafer. The transmission member 120 may be integrally formed in one body together with the vibration generator 110. The transmission member 120 may make contact with a cleaning solution supplied onto the wafer. Accordingly, the transmission member 120 may transmit the ultrasonic vibration generated at the ultrasonic vibration generator 110 to the cleaning solution. The ultrasonic vibration may vibrate the cleaning solution, and thus contaminants such as particles and unnecessary layers are easily removed from the wafer.

For example, the transmission member 120 may include quartz, sapphire, silicon carbide, boron nitride, vitreous carbon, etc. These may be used alone or in a combination thereof.

The transmission member 120 may include at least one material. The material in the transmission member 120 may have a solid phase, a liquid phase or a gas phase. In the present example embodiment, the material in the transmission member 120 may be arranged into a thin layer to thereby form a material layer 122 in the transmission member 120. Therefore, a single material may be arranged into a single material layer and a plurality of the materials may be arranged into a plurality of material layers in the transmission member 120. The material layer 122 is different from the transmission member 120, and thus the vibration transmission through the material layer 122 is different from that through the transmission member 120. Accordingly, the intensity and the direction of the vibration may be varied in accordance with the materials of the material layer 122. Therefore, the intensity and the direction of the ultrasonic vibration may be controlled by physical characteristics of the material layer 122 such as the number of layers, an individual layer thickness and an individual layer width of the material layer 122.

In example embodiments, a single layer may be used as the material layer 122 shown in FIG. 1, and a plurality of layers may also be used as the material layer 122 shown in FIGS. 2 to 4. When a plurality of the layers is used as the material layer 122, each of the layers in the material layer 122 may include one of solid material, liquid material and gas material. For example, each of the layers in the material layer 122 may have the same or different phase of material. The material layer 122 may be arranged perpendicular to or parallel with the upper surface of the wafer. Accordingly, the intensity and the direction of the ultrasonic vibration are easily controlled by changing the number of layers and compositions of the material layer 122.

In example embodiments, when each layer of the material layer 122 may be formed into a uniform thickness as shown in FIGS. 1 to 3, the change of the intensity and the direction of the vibration transmitting through the material layer 122 may be constant. In contrast, when each of the layers has a non-uniform thickness in the material layer 122 and thus the thickness of each layer may be partially varied in the transmission member 120, as shown in FIG. 4, the intensity of the direction of the vibration may be varied in accordance with the partial thickness of the material layer 122. In such a case, each layer of the material layer 122 may be artificially controlled to have a non-uniform thickness so as to change the intensity and the direction of the ultrasonic vibration. For example, the ultrasonic vibration may be transmitted into the same direction to thereby be concentrated into the same position, may be transmitted into various directions to thereby scattered in all directions, or may be reflected from the material layer 122 to thereby prevent the ultrasonic vibration from transmitting through the material layer 122 by controlling the thickness of each layer of the material layer 122.

In example embodiments, the width of the material layer 122 may be substantially equal to or smaller than the width of the transmission member 120. When the width of the material layer 122 may be substantially equal to the width of the transmission member 120, the intensity and the direction of the ultrasonic vibration may be varied by the material layer 122 along a whole surface of the transmission member 120. In contrast, when the width of the material layer 122 may be smaller than the width of the transmission member 120, the intensity and the direction of the ultrasonic vibration may be varied by the material layer 122 at every location at which the material layer 122 is positioned in the transmission layer.

The number of layers, the thickness and the width of the material layer 122 may be respectively controlled according to a shape of the pattern on the wafer. For example, when the wafer may include a relatively complicated and small pattern the number of layers, the thickness and the width of the material layer 122 may be controlled in such a manner that the ultrasonic vibration having a relatively high intensity may be applied onto the wafer or the ultrasonic vibration may be sufficiently concentrated to the pattern on the wafer. In contrast, when the wafer may include a relatively simple and large pattern, the number of layers, the thickness and the width of the material layer 122 may be controlled in such a manner that the ultrasonic vibration having a relatively low intensity may be applied onto the wafer or the ultrasonic vibration may be scattered in many directions on the whole wafer so that the ultrasonic vibration may be applied to the patterns on the wafer as much as possible.

The transmission member 120 including the material layer 122 may control the intensity and the direction of the ultrasonic vibration and apply the ultrasonic vibration to the cleaning solution. Accordingly, the transmission member 120 may transmit the optimum ultrasonic vibration for cleaning the wafer to the cleaning solution.

Further, when the cleaning solution is not distributed on the wafer to a sufficient thickness, the material layer 122 may compensate for an insufficient thickness of the cleaning solution to prevent the pattern of the wafer from being damaged by the ultrasonic vibration.

Figure 5:
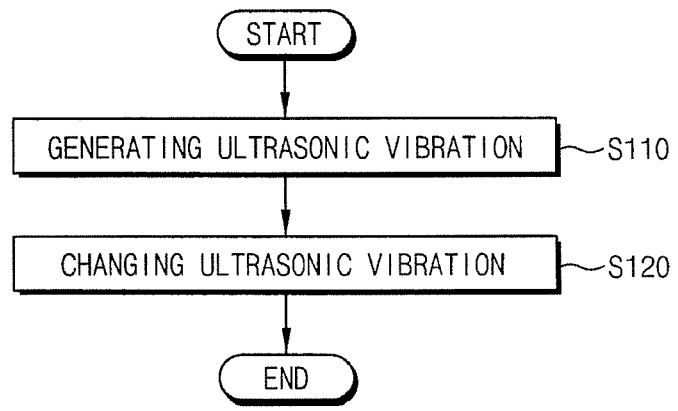
FIG. 5 is a flowchart illustrating a method of generating an ultrasonic vibration in accordance with an example embodiment of the present invention.

FIG. 5 is a flowchart illustrating a method of generating an ultrasonic vibration in accordance with an example embodiment of the present invention.

Referring to FIG. 5, the method of generating the ultrasonic vibration in accordance with example embodiments of the present invention is provided. The ultrasonic vibration may be generated by using an ultrasonic vibration generator 110 in step S110.

For example, electric power is applied to the ultrasonic vibration generator 110 such as a piezoelectric transducer so that the ultrasonic vibration generator 110 generates the ultrasonic vibration by converting electric energy into physical vibration energy.

The intensity and the direction of the ultrasonic vibration are controlled by transmitting the ultrasonic vibration through a material layer 122 of a transmission member 120 in step S120. The ultrasonic vibration may transmit through the material layer 122. The material layer 122 may be positioned at an inside of the transmission member 120 and may include a material having a solid phase, a liquid phase or a gas phase. Because the vibration transmission through the material layer 122 is generally different from that through the transmission member 120, the intensity and the direction of the ultrasonic vibration may be controlled by physical characteristics of the material layer 122 such as the number of layers, an individual layer thickness and an individual layer width of the material layer 122. Accordingly, the ultrasonic vibration may be transmitted into the same direction and be concentrated into the same position, may be transmitted into various directions to thereby scattered in all directions, or may be reflected from the material layer 122 to thereby prevent the ultrasonic vibration from transmitting through the material layer 122. As one example, a single layer may be used as the material layer 122 and a plurality of layers may also be used as the material layer 122. When a plurality of the layers is used as the material layer 122, the plurality of material layers 122 may be arranged perpendicular to or parallel with the upper surface of the wafer. As another example, each layer of the material layer 122 may have a uniform thickness or a non-uniform thickness. As still another example, the width of the material layer 122 may be substantially equal to or smaller than the width of the transmission member 120.

Figure 6:
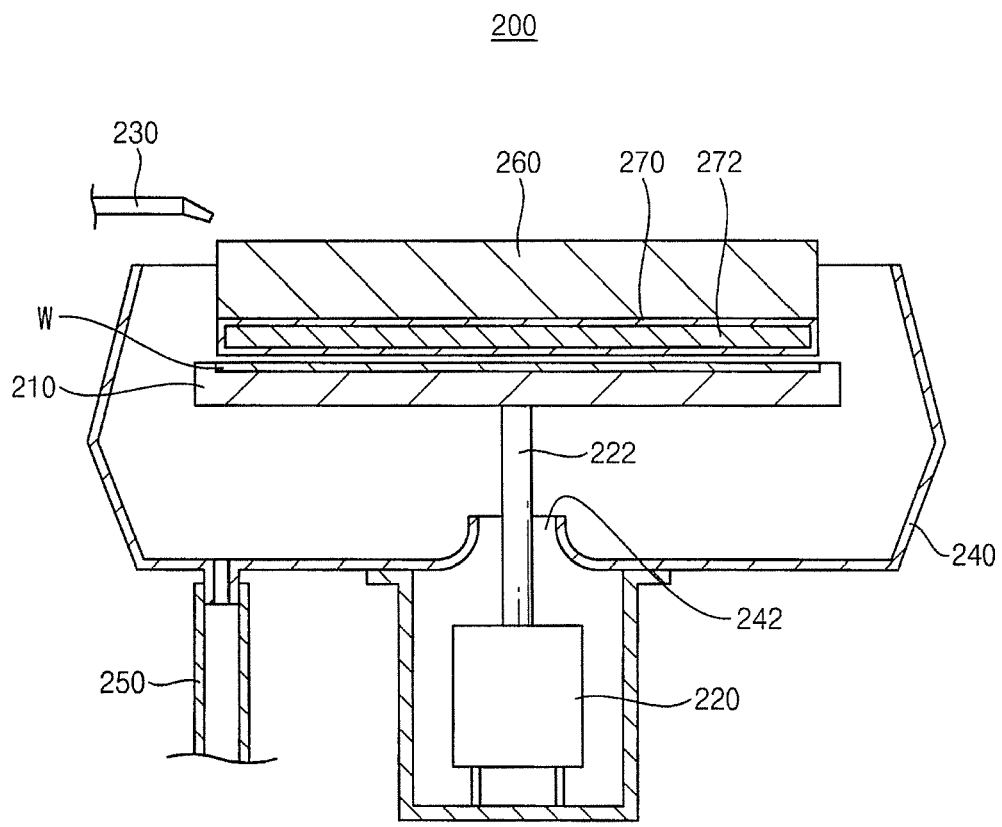
FIG. 6 is a cross-sectional view illustrating an apparatus of cleaning a wafer in accordance with an example embodiments of the present invention.

The number of layers, the thickness and the width of the material layer 122 may be respectively controlled according to a shape of the pattern on the wafer. For example, when the wafer may include a relatively complicated and large pattern, the number of layers, the thickness and the width of the material layer 122 may be controlled in such a manner that the ultrasonic vibration having a relatively high intensity may be applied onto the wafer or the ultrasonic vibration may be sufficiently concentrated to the complicated pattern on the wafer. In contrast, when the wafer may include a relatively simple and small pattern, the layer number, the thickness and the width of the material layer 122 may be controlled in such a manner that the ultrasonic vibration having a relatively low intensity may be applied onto the wafer or the ultrasonic vibration may be scattered in many directions on the whole wafer so that the ultrasonic vibration may be applied to the patterns on the wafer as much as possible. FIG. 6 is a cross-sectional view illustrating an apparatus of cleaning a wafer in accordance with example embodiments of the present invention.

Referring to FIG. 6, the apparatus of cleaning the wafer 200 may include a supporter 210, a driver 220, a cleaning solution supplier 230, a bowl 240, an outlet 250, an ultrasonic vibration generator 260, and a transmission member 270.

The supporter 210 may have a disc shape and support a cleaning wafer W thereon.

The driver 220 may be positioned under the supporter 210 and may apply a rotating power to the supporter 210 through a rotating axis 222. For example, the driver 220 may include a motor.

The cleaning solution supplier 230 may be positioned over the wafer W and supply a cleaning solution for cleaning the wafer W onto the wafer W. As one example, the cleaning solution may include deionized water ($H_2O$). As another example, the cleaning solution may include a mixture of ammonium hydroxide ($NH_4OH$), hydrogen peroxide ($H_2O_2$) and deionized water ($H_2O$), a mixture of hydrogen fluoride (HF) and deionized water ($H_2O$), a mixture of ammonium fluoride ($NH_4F$), hydrogen fluoride (HF) and deionized water ($H_2O$), a mixture of phosphoric acid ($H_3PO_4$) and deionized water ($H_2O$), etc.

The bowl 240 may surround a side of the supporter 210 and may prevent the cleaning solution from dispersing around the wafer W due to the rotation of the wafer W. The bowl 240 may have an opening 242 for receiving the rotation axis 222. The opening 242 is formed through a center portion of a bottom plate of the bowl 240.

The outlet 250 is positioned at a side of the bottom plate of the bowl 240. The outlet 250 discharges the cleaning solution scattered from the wafer W.

The ultrasonic vibration generator 260 and the transmission member 270 are substantially identical to the ultrasonic vibration generator 110 and the transmission member 120 already illustrated in FIGS. 1 to 4. Thus, any further explanation will be omitted.

The apparatus 200 may control the intensity and the direction of the ultrasonic vibration by using the transmission member 270 and apply the ultrasonic vibration to the cleaning solution. Accordingly, the transmission member 270 may transmit the optimum ultrasonic vibration for cleaning the wafer W to the cleaning solution.

Further, when the cleaning solution is not distributed on the wafer to a sufficient thickness, the material layer 272 may compensate for an insufficient thickness of the cleaning solution to prevent the pattern of the wafer W from being damaged by the ultrasonic vibration.

FIG. 7 is a flowchart illustrating a method of cleaning a wafer in accordance with an example embodiment of the present invention.

Referring to FIG. 7, the method of cleaning the wafer in accordance with example embodiments of the present invention is provided. A cleaning wafer W is loaded onto a supporter 210. The driver 220 rotates the supporter 210 so that the supporter 210 rotates the wafer W supported thereon. An ultrasonic vibration generator 260 is positioned over the wafer W and a transmission member 270 is positioned between the ultrasonic vibration generator 260 and the wafer W. The transmission member 270 may be coupled to the ultrasonic vibration generator 260 or be integrally formed in one body together with the ultrasonic vibration generator 260. The transmission member 270 may be separated by an interval from an upper portion of the wafer W. A cleaning solution supplier 230 supplies a cleaning solution for cleaning the wafer W onto the wafer W in step S210.

Due to the rotation of the wafer W, the cleaning solution may be provided between the transmission member 270 and the wafer W. During a process for cleaning the wafer W, the cleaning solution is continuously supplied to the wafer W and the wafer W is continuously rotated.

An ultrasonic vibration is generated by an operation of the ultrasonic vibration generator 260 in step S220.

For example, electric power is applied to the ultrasonic vibration generator 260 such as a piezoelectric transducer so that the ultrasonic vibration generator 260 generates the ultrasonic vibration by converting electric energy into physical vibration energy.

The intensity and the direction of the ultrasonic vibration are controlled by transmitting the ultrasonic vibration through a material layer 272 of the transmission member 270 in step S230.

The control of the intensity and the direction of the ultrasonic vibration in step S230 are substantially identical to the control of the intensity and the direction of the ultrasonic vibration in step S120 already illustrated in FIG. 5. Thus, any further explanation will be omitted.

After the intensity and the direction of the ultrasonic vibration are controlled, the ultrasonic vibration is applied to the cleaning solution on the wafer W through the transmission member 270 in step S240.

The ultrasonic vibration vibrates the cleaning solution to accelerate a reaction between the cleaning solution and contaminants on the wafer W. Accordingly, the ultrasonic vibration may improve the efficiency of removing the contaminants.

The cleaning solution including the contaminants is scattered from the wafer W and blocked by a bowl 240. The cleaning solution is moved to a bottom plate of the bowl 240 to be discharged through an outlet 250.

According to the present invention, the intensity and the direction of the ultrasonic vibration are changed in accordance with one of the number of the material layers, the thickness of each material layer and the width of each material layer. After the intensity and the direction of the ultrasonic vibration are controlled, the ultrasonic vibration is applied to the cleaning solution on the wafer. Accordingly, the wafer may be easily cleaned.

Further, when the cleaning solution is not distributed on the wafer to a sufficient thickness, the material layer 122 may compensate for an insufficient thickness of the cleaning solution to prevent the pattern of the wafer from being damaged by the ultrasonic vibration.

This invention has been described with reference to the example embodiments. It is evident, however, that many alternative modifications and variations will be apparent to those having skill in the art in light of the foregoing description. Accordingly, the present invention embraces all such alternative modifications and variations as fall within the spirit and scope of the appended claims.

What is claimed is:

1. An apparatus for generating an ultrasonic vibration, the apparatus comprising:
   an ultrasonic vibration generator generating an ultrasonic vibration;
   a transmission member positioned at an end portion of the ultrasonic vibration generator; and
   a plurality of material layers disposed within the transmission member and configured to control an intensity and a direction of the ultrasonic vibration, the ultrasonic vibration being transmitted to a cleaning solution for cleaning a wafer through the transmission member and the plurality of material layers,
   wherein the transmission member completely surrounds each of the material layers by being in direct contact with top, bottom and side portions of each material layer and prevents each of the material layers from directly contacting the ultrasonic vibration generator, and
   wherein at least one material layer of the plurality of material layers comprises a gas phase.

2. The apparatus of claim 1, wherein the at least one material layer of the plurality of material layers comprises a solid phase.

3. The apparatus of claim 1, wherein the intensity and the direction of the ultrasonic vibration are changed in accordance with at least one of a number of the material layers, a thickness of each of the material layers and a width of each of the material layers.

4. The apparatus of claim 1, wherein at least one material layer comprises a liquid phase.

5. The apparatus of claim 1, wherein the intensity and the direction of the ultrasonic vibration are changed in accordance with at least two of a number of the material layers, a thickness of each material layer and a width of each material layer.

6. The apparatus of claim 1, wherein the intensity and the direction of the ultrasonic vibration are changed in accordance with a number of the material layers, a thickness of each material layer and a width of each material layer.

7. The apparatus of claim 1, wherein at least one material layer is divided into noncontiguous sections separated by the transmission member.

8. The apparatus of claim 1 wherein at least one of the material layers includes more than one thickness.

9. The apparatus of claim 1, wherein at least one material layer of the plurality of material layers comprises a solid phase, and
   wherein at least one material layer of the plurality of material layers comprises a liquid phase.

10. The apparatus of claim 1, wherein at least one material layer is divided into noncontiguous sections separated by the transmission member.

11. An apparatus for cleaning a wafer, the apparatus comprising:
    a cleaning solution supplier positioned over the wafer and supplying a cleaning solution onto the wafer;
    an ultrasonic vibration generator positioned over the wafer and generating an ultrasonic vibration;
    a transmission member positioned at an end portion of the ultrasonic vibration generator; and
    a plurality of material layers disposed within the transmission member and configured to control an intensity and a direction of the ultrasonic vibration, the ultrasonic vibration being transmitted to a cleaning solution for cleaning a wafer through the transmission member and the plurality of material layers,
    wherein the transmission member completely surrounds each of the material layers by being in direct contact with top, bottom and side portions of each material layer and prevents each of the material layers from directly contacting the ultrasonic vibration generator, and
    wherein at least one material layer of the plurality of material layers comprises a gas phase.

12. The apparatus of claim 11, wherein at least one material layer comprises a solid phase.

13. The apparatus of claim 11, wherein the intensity and the direction of the ultrasonic vibration are changed in accordance with at least one of a number of the material layers, a thickness of each material layer and a width of each material layer so that the intensity and the direction of the ultrasonic vibration are corresponding to a shape of a pattern formed on the wafer.

14. The apparatus of claim 11, wherein the transmission member is integrally formed in one body together with the vibration generator.

15. The apparatus of claim 11, wherein at least one material layer comprises a liquid phase.

16. The apparatus of claim 11, wherein the intensity and the direction of the ultrasonic vibration are changed in accordance with at least two of a number of the material layers, a thickness of each material layer and a width of each material layer.

17. The apparatus of claim 11, wherein the intensity and the direction of the ultrasonic vibration are changed in accordance with a number of the material layers, a thickness of each material layer and a width of each material layer.

18. The apparatus of claim 11 wherein at least one material layer is divided into noncontiguous sections separated by the transmission member.

19. The apparatus of claim 11 wherein at least one of the material layers includes more than one thickness.

20. The apparatus of claim 11 wherein at least one material layer of the plurality of material layers comprises a solid phase, and wherein at least one material layer of the plurality of material layers comprises a liquid phase.

* * * * *